United States Patent [19]
Brown

[11] Patent Number: 5,635,934
[45] Date of Patent: Jun. 3, 1997

[54] DIGITAL READ CHANNEL UTILIZING ANALOG-TO-DIGITAL CONVERTER WITH OFFSET REDUCTION

[75] Inventor: Gary A. Brown, Fremont, Calif.

[73] Assignee: National Semiconductor Corporation, Santa Clara, Calif.

[21] Appl. No.: 399,734

[22] Filed: Mar. 7, 1995

[51] Int. Cl.$^6$ .............................. G11B 5/003; G11B 5/00
[52] U.S. Cl. .............................. 341/118; 341/155; 360/66
[58] Field of Search .............................. 341/110, 118, 341/155, 171, 144; 360/66, 59

[56] References Cited

U.S. PATENT DOCUMENTS

| | | | |
|---|---|---|---|
| 4,143,361 | 3/1979 | Tammes et al. | 340/347 |
| 4,750,058 | 6/1988 | Hirt et al. | 360/46 |
| 4,929,918 | 5/1990 | Chung et al. | 331/10 |
| 5,097,489 | 3/1992 | Tucci | 375/120 |
| 5,111,203 | 5/1992 | Calkins | 341/141 |
| 5,168,246 | 12/1992 | Pulluru et al. | 331/8 |
| 5,319,450 | 6/1994 | Tamayama et al. | 348/692 |
| 5,367,411 | 11/1994 | Nishiyama et al. | 360/66 |
| 5,477,142 | 12/1995 | Good et al. | 341/166 |

OTHER PUBLICATIONS

William D. Llewellyn, et al., High–Speed Data Recovery (WAM 1.1: A 33Mb/s Data Synchronizing Phase–Locked Loop Circuit, presented on Feb. 17, 1988 at the IEEE International Solid–States Circuit Conference.

National Semiconductor DP8459 Data Sheet, Mass Storage Handbook, 1989, pp. 2–29 through 2–63.

Beomsup Kim, High–Speed Clock Recovery in VLSI Using Hybrid Analog/Digital Techniques, Memo #UCB/ERL M90/50, Jun. 6, 1990, Elect. Research Lab., UC Berkeley (particualary p. 81).

Frank Goodenough, DSP Technique Nearly Doubles Disk Capacity, Electronic Design, Feb. 4, 1993, pp. 53–56 and 58.

J.D. Coker, R.L. Galbraith, G.J. Kerwin, J.W. Rae, P.A. Ziperovich, Implementation of PRML in a Rigid Disk Drive, IBM Storage Systems Products Division, Rochester, MN 55901, San Jose, CA 95193.

Timothy J. Schmerbeck et al., A 27MHz Mixed Analog/Digital Magnetic Recording Channel DSP Using Partial Response Signalling with Maximum Likelihood Detection, IEEE Internat'l Solid State Circuits Conference 1991.

*Primary Examiner*—Jeffrey A. Gaffin
*Assistant Examiner*—Peguy Jean Pierre
*Attorney, Agent, or Firm*—Limbach & Limbach L.L.P.

[57] ABSTRACT

An analog-to-digital converter (ADC) voltage offset (VOS) reduction circuit architecture is for use with an ADC that includes a resistive ladder network and a differential-to-single ended converter. The DC level of the single-ended output of the differential-to-single ended converter is nominally set at the mid-point of the resistive ladder network. The VOS reduction circuit includes a VOS comparator bank that receives the single-ended output, compares it with a plurality of input signals from the resistive ladder network, and provides the result of the comparison as a plurality of VOS comparator bank signals. A current digital-to-analog converter (IDAC) is coupled to receive the VOS comparator bank signals, via a latch bank, and to provide a current responsive thereto. The current from the IDAC may be provided as a trim current for adjusting the DC level of the single-ended output of the ADC differential-to-single ended converter to be closer to the mid-point of the resistive ladder network, thus reducing voltage offset caused, for example, by variations in process and temperature.

10 Claims, 5 Drawing Sheets

DIGITAL READ CHANNEL UTILIZING ANALOG-TO-DIGITAL CONVERTER WITH OFFSET REDUCTION

FIELD OF THE INVENTION

The present invention relates to analog-to-digital converters ("ADC's") and, in particular, to an ADC that detects and corrects a voltage offset of the ADC.

BACKGROUND

Figure 1:
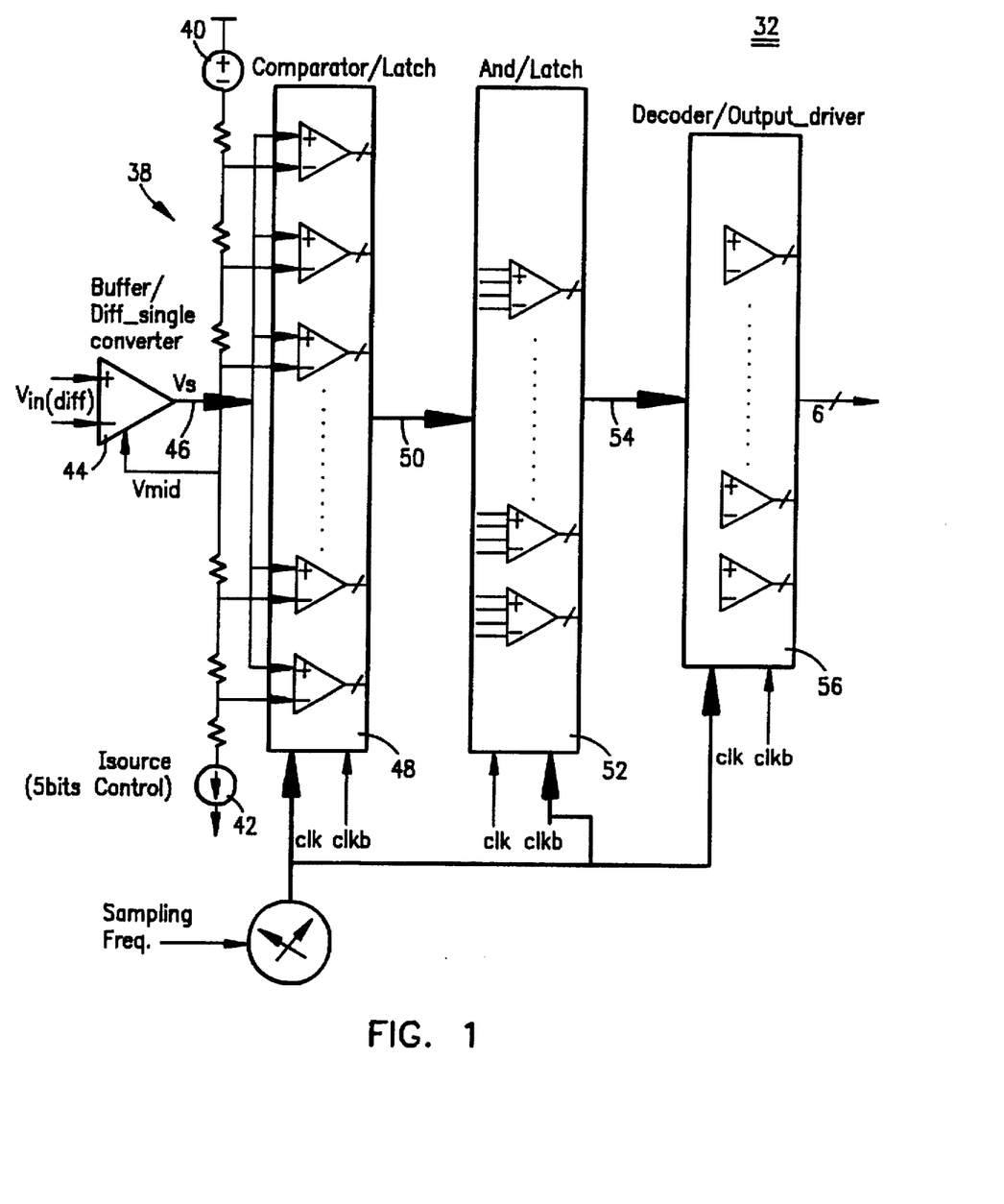
FIG. 1 is a block diagram of an analog-to-digital converter ("ADC") with which a voltage offset "VOS") reduction circuit of the present invention is utilizable.

Analog-to-digital converters (ADC's) play a fundamental role in the execution of sample detection techniques used in disk drive read channels. FIG. 1 is a block diagram showing an ADC 32 as described in commonly-assigned and copending application Ser. No. 08/288,448, filed Aug. 10, 1994, by Toan Tran ("the '448 application"). The '448 application is hereby incorporated by reference to provide additional background information regarding the present invention.

As shown in FIG. 1, the ADC 32 includes a resistive ladder network 38 that includes matching resistors connected in series to a positive voltage supply 40. The series-connected resistors, which have a mid-point voltage level $V_{mid}$, are connected to a negative voltage supply via a current source 42.

As further shown in FIG. 1, ADC 32 includes a differential-to-single ended converter 44 that converts a differential analog signal Vin(diff) to a corresponding single-ended analog signal 46. Significantly, the output of the differential-to-single ended converter 44 is controlled by the mid-point voltage level $V_{mid}$ of the resistive ladder network 38 such that the voltage level $V_S$ of the single-ended analog read signal 46 has a DC level nominally equal to the mid-point of the resistive ladder network 38. (Those skilled in the art will appreciate that the voltage range of the analog-to-digital convertor 32 is controlled by the current pulled through the resistive ladder network 38.)

ADC 32 further includes a comparator latch bank 48 that includes a number of comparators. Each comparator in the comparator latch bank 48 receives both the single ended output signal 46 of the differential-to-single ended convertor 44 and a signal provided from an interconnection between two adjacent resistors in the resistive ladder network 38. The comparator latch bank 48 responds to the rising edges of an externally-provided clock signal CLK CLKB to provide a plurality of comparator latch bank output signals 50.

Since each of the comparators in the comparator latch bank 48 is comparing the signal output 46 of the single-ended converter 44 against reference voltage points on the resistive ladder 38 that increase and decrease from the mid-point level $V_{mid}$, the output 50 of the comparator latch bank 48 comprises a sequence of 0's, representing the comparators in the latch bank 48 for which the level of the reference voltage is greater than the level of the output 46, and a sequence of 1's, representing the comparators in the latch bank 48 for which the level of the reference voltage is less than the level of the output 46.

The AND/latch bank 52 responds to pairs of adjacent bits of the so-called "thermometer code" output 50 of the comparator latch bank 48 on the falling edges of the clock signal CLK CLKB by providing a 64-bit output 54 that is unique to the signal level of the single-ended converter output 46. This 64-bit code 54 serves as the input to the decoder/output latch 56, which functions essentially as a look-up table to provide the 6-bit digital output.

The range of the ADC 32 is programmable via a 5-bit digital input to the current source 42. This allows the range of the ADC 32 to vary from 1 to 2 times $V_{pp}$ of the input signal. This programmability allows selection of the optimum range for reading data from each sector on the disk drive storage element 12.

The differential to single-ended converter 44 may be of the type described in commonly assigned and U.S. Pat. No. 5,432,476, also by Toan Tran the '476 patent. The '949 application is hereby incorporated by reference to provide additional background information regarding the present invention.

Figure 2:
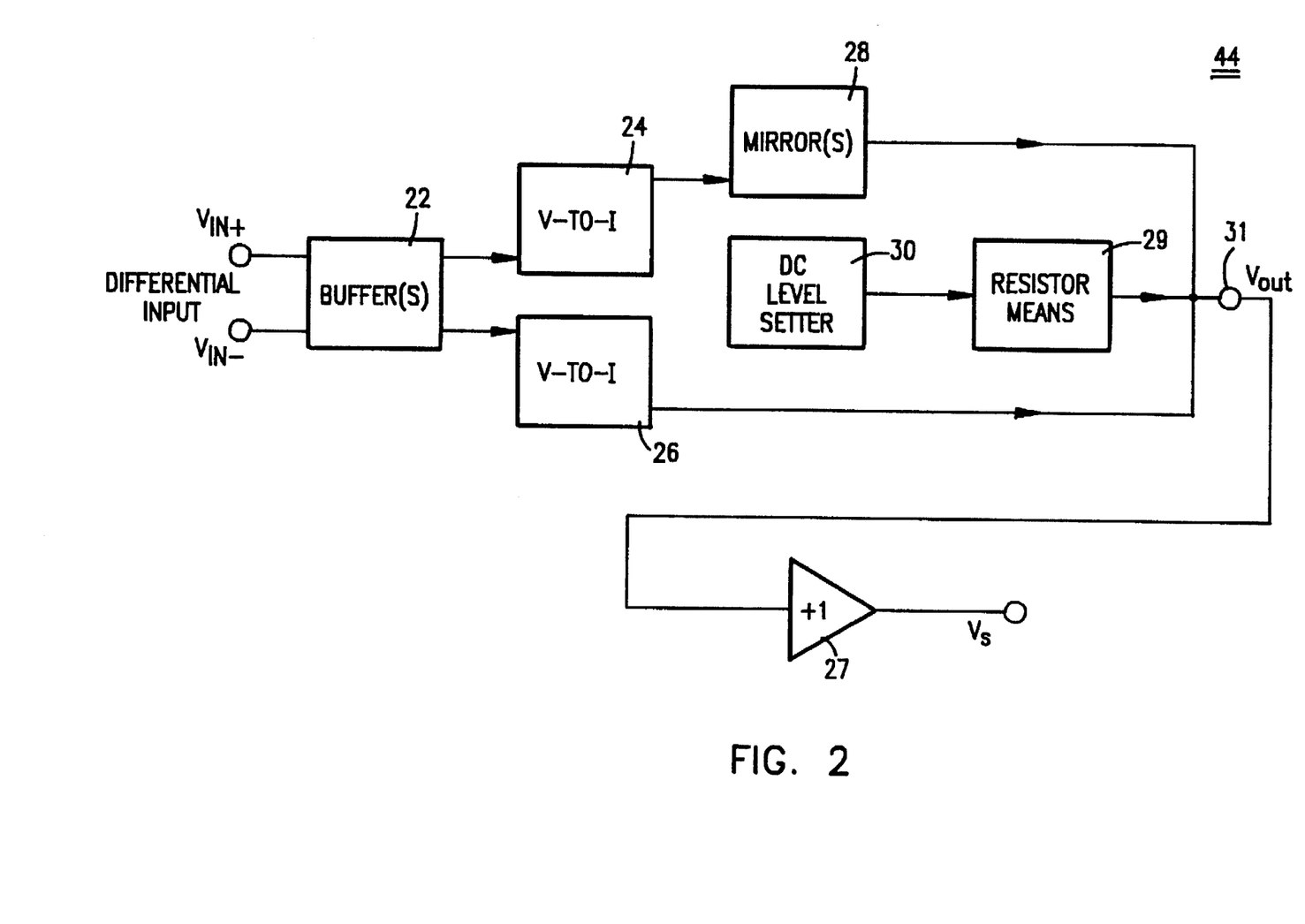
FIG. 2 is a block diagram of a differential-to-single ended converter which may be used in the circuit of FIG. 1.

FIG. 2 is a block diagram illustrating a differential to single-ended converter 20 of the type described in the '476 petent. A differential input signal ($V_{IN+}$, $V_{IN-}$) is provided to an input buffer 22. The input buffer 22 provides the differential input $V_{IN+}$, $V_{IN-}$ to respective V-to-I converters 24, 26. A first of the V-to-I converters 24 provides its output to a mirror unit 28. A DC level setter 30 establishes a DC voltage level which it provides to resistor means 29. The outputs of the mirror unit 28, the resistor means 29, and the second V-to-I converter 26 are combined to provide a single-ended output signal $V_{OUT}$ at a terminal 31. A unity voltage gain stage 27 receives the single-ended output signal $V_{OUT}$ from the terminal 31 and provides a single-ended drive signal $V_S$ which can drive a load.

A problem with many ADC's, including those which include a differential-to-single ended converter of the type shown in FIG. 2, is that there is typically a voltage offset (VOS) in the single-ended output signal they generate. For example, referring to differential-to-single ended converter in FIG. 2, VOS may be caused by mismatch of transistors within the input buffer 22, and this VOS evidences itself as a difference between the DC level of $V_S$ and $V_{mid}$ in the single-ended output signal of the differential-to-single ended converter. VOS may be caused, for example, by process variations in the fabrication of the ADC components. Similarly, operating temperature variations will cause VOS. VOS in the single-ended drive signal $V_S$ results in an error in the digital output of the ADC.

Therefore, what is desired is an ADC which can both detect and correct for VOS.

SUMMARY

The present invention provides an analog-to-digital converter (ADC) voltage offset (VOS) reduction circuit architecture for use with an ADC that includes a resistive ladder network and a differential-to-single ended converter. The DC level of the single-ended output is nominally set at the mid-point of the resistive ladder network.

The VOS reduction circuit includes a VOS comparator bank to receive the single-ended output, to compare it with a plurality of input signals from the resistive ladder network, and to provide the result of the comparison as a plurality of VOS comparator bank signals. A current digital-to-analog converter (IDAC) is coupled to receive the VOS comparator bank signals, via a latch bank, and to provide a current responsive thereto.

The current from the IDAC may be provided as a trim current for adjusting the DC level of the single-ended output of the ADC differential-to-single ended converter to be closer to the mid-point of the resistive ladder network, thus reducing voltage offset caused, for example, by variations in process and temperature.

A better understanding of the features and advantages of the present invention will be obtained by reference to the following detailed description and accompanying drawings which set forth an illustrative embodiment in which the principles of the invention are utilized.

DETAILED DESCRIPTION

Figure 3:
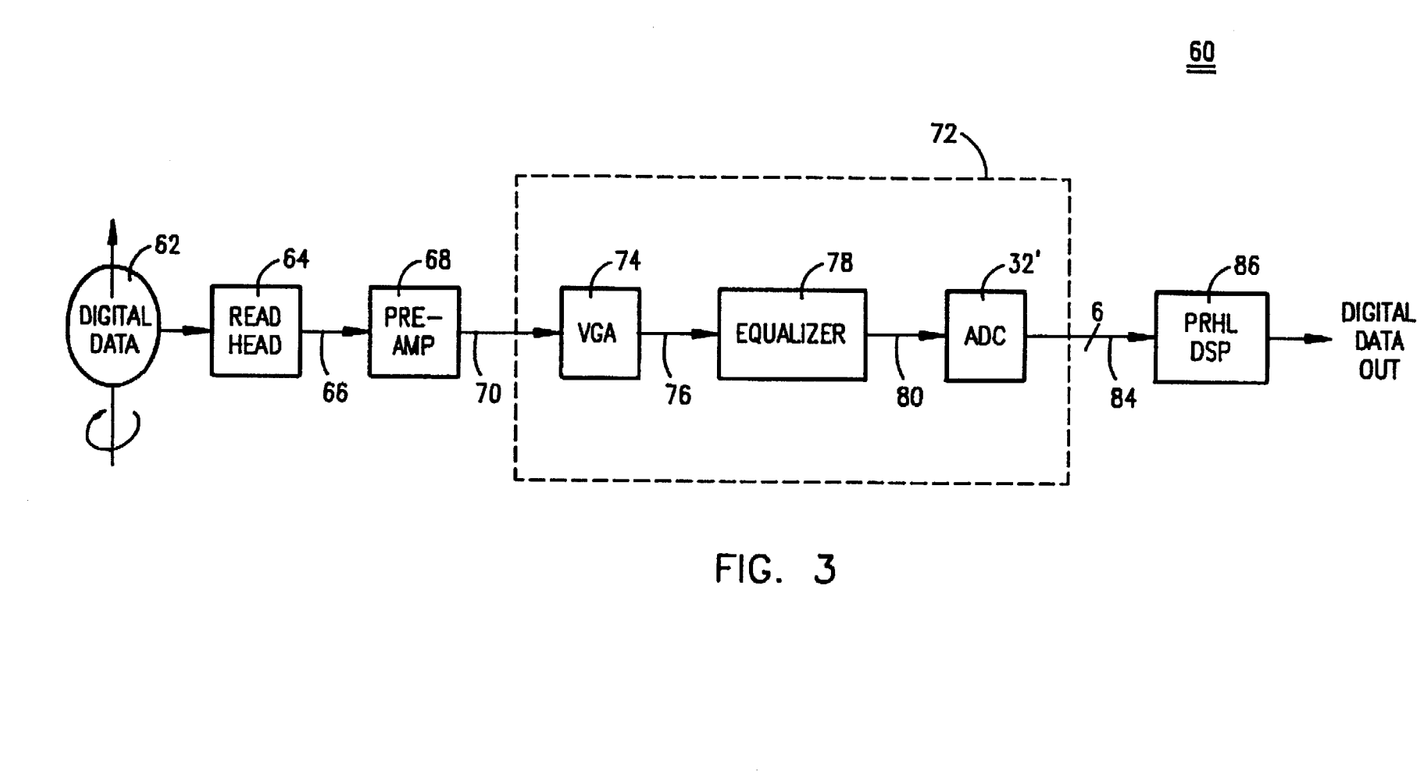
FIG. 3 is a block diagram illustrating a read channel system in accordance with the present invention.

FIG. 3 shows a read channel system 60 for reading digital data stored on a hard disk drive storage element 62. The read channel system 60 includes a magnetic read head 64 that senses digital data stored on the disk drive storage element 62 and generates a corresponding differential analog read data signal 66. A pre-amplifier 68 then preamplifies the analog read data signal 66 to provide a pre-amplified analog read data signal 70. As further shown in FIG. 3, the pre-amplified analog read data signal 70 is provided to a read channel circuit 72. Each of the above-described operations may be performed utilizing conventional hardware in a manner well known to those skilled in the art.

The read channel circuit 72 includes a conventional variable gain amplifier 74 that receives the pre-amplified analog read data signal 70 as an input and provides an amplified analog read signal 76 as an output. An equalizer 78 shapes the transitions of waveform of the amplified analog read signal 76 in the conventional manner to provide a differential equalized analog read signal 80. An analog-to-digital converter ("ADC") 32' then converts the equalized analog read signal 80 into a sequence of 6-bit digital data characters 84 corresponding to the waveform of the equalized analog read signal 80.

Finally, a digital signal processor 86, preferably one that utilizes partial response maximum likelihood (PRML) detection techniques, recovers the digital data from the sequence of digital data characters 84. The PRML digital signal processor 86 can be of conventional design.

Figure 4:
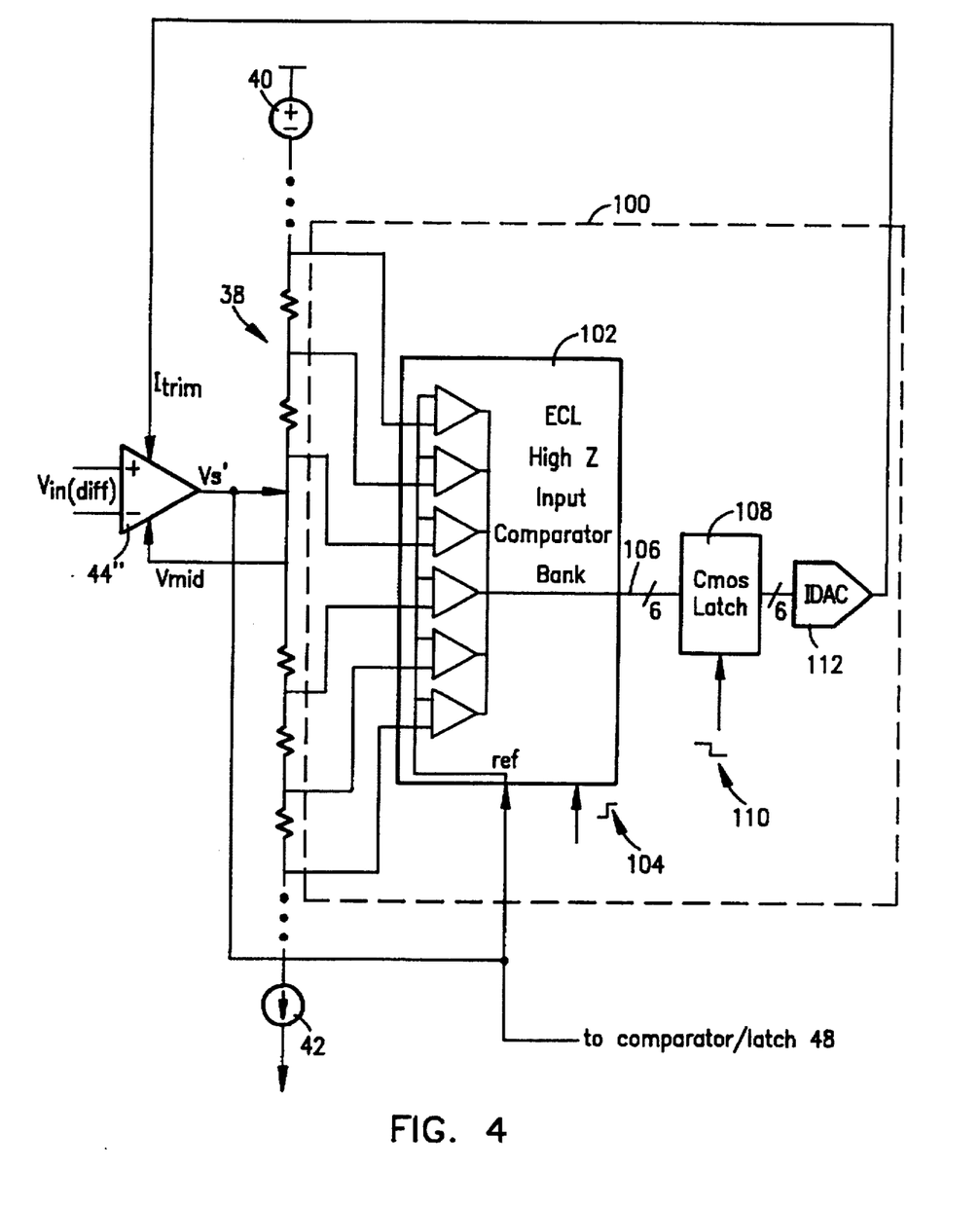
FIG. 4 is a block diagram illustrating a VOS reduction circuit in accordance with the present invention.

FIG. 4 is a block diagram which illustrates an embodiment of a VOS reduction circuit 100 in accordance with the present invention. The magnitude of a trim current $I_{trim}$ output from the VOS reduction circuit 100 provides an indication of the amount of the voltage offset of the output $V_S'$ of a differential-to-single ended converter 44'. $I_{trim}$ is set while the differential-to-single ended converter is in a configuration mode, with the + and − inputs of the differential-to-single ended converter 44' tied to a common level (i.e. with Vin(diff) equal to zero). The differential-to-single ended converter 44' has circuitry which, in an operating mode, utilizes $I_{trim}$ to reduce the voltage offset a signal at its output. (In FIG. 4, the signal at the output of differential-to-single ended converter 44' is designated as $V_S'$.)

Referring still to FIG. 4, an emitter-coupled logic high-impedance comparator bank 102 includes a number of comparators. Six comparators are shown in FIG. 4. Each of the six comparators receives both the single ended output signal $V_S'$ of the differential-to-single ended convertor 44' and a signal provided from the interconnection between two adjacent resistors in the resistive ladder network 38. The comparators of the comparator bank 102 respond to a rising edge of an externally-provided signal 104 to provide a six bit comparator output signal 106.

Since each of the comparators in the comparator bank 102 is comparing $V_S'$ against reference voltage points on the resistor ladder 38 that increase and decrease from the mid-point level $V_{mid}$, the output 106 of the comparator bank 102 comprises a sequence of 0's, representing the comparators in the comparator bank 102 for which the level of the reference voltage is greater than the level of $V_S'$, and a sequence of 1's, representing the comparators in the comparator bank 102 for which the level of the reference voltage is less than the level of $V_S'$.

A CMOS latch 108 responds to a falling edge of an externally provided signal 110 to latch the so-called "thermometer code" output 106 of the comparator bank 102. This latched thermometer code serves as the input to a current digital-to-analog converter (IDAC) 112. IDAC 112 provides the trim current $I_{trim}$. It should be noted that IDAC 112 either sinks or sources current (i.e., that $I_{trim}$ is either positive or negative) depending on the direction of voltage offset.

By providing more comparators in the comparator bank 102, and a corresponding additional number of latches in the latch bank 108, the magnitude of voltage offset which can be corrected for is increased. Also, by changing the particular resistor interconnections from which signals are provided to the comparators, the resolution of the voltage offset correction can be varied. Furthermore, depending on the architecture of IDAC 112, the polarity of the comparator outputs of the comparator bank 102 may be reversed so that IDAC 112 sinks and sources current appropriately.

Figure 5:
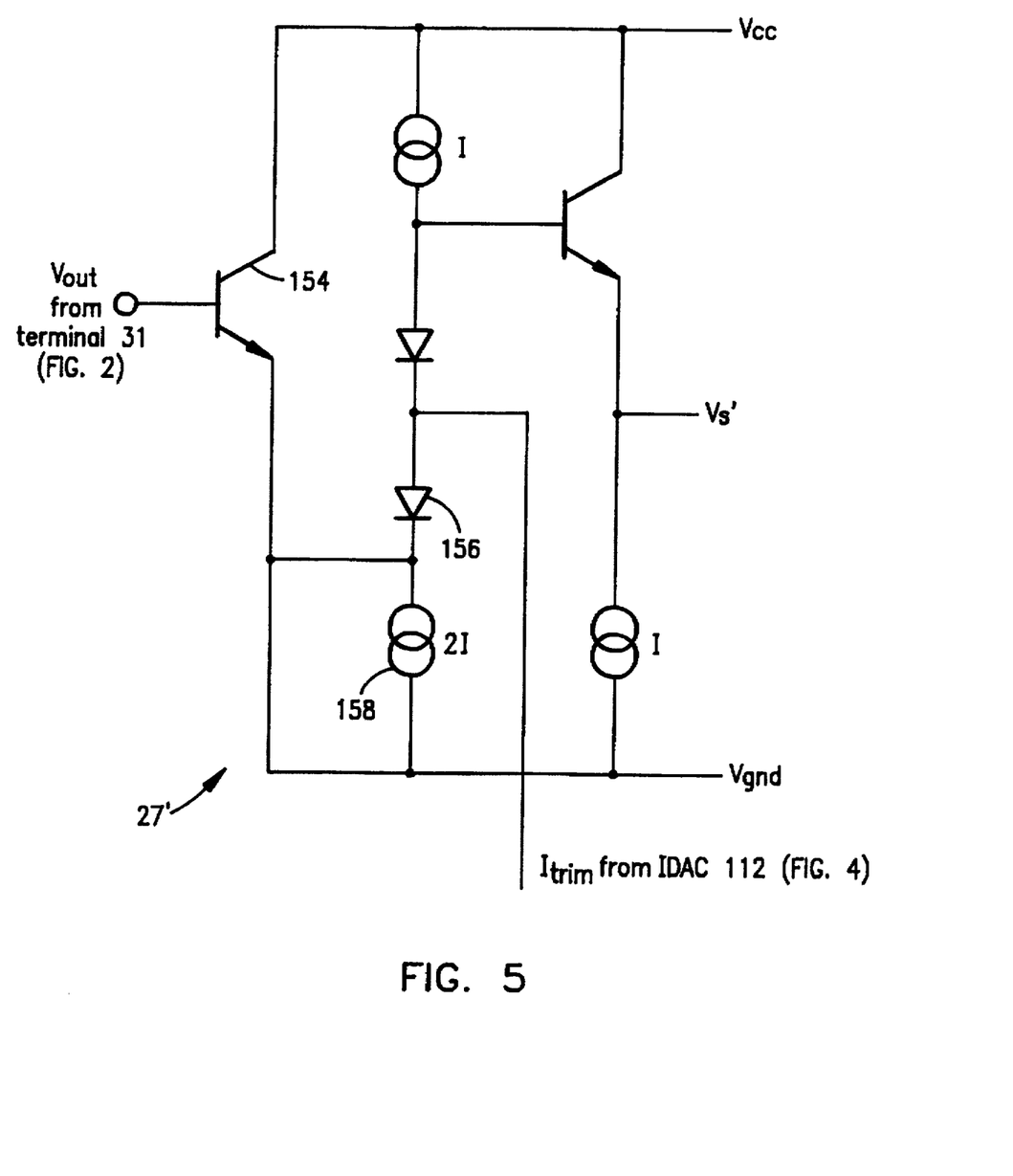
FIG. 5 is a schematic diagram of a gain stage circuit utilizable with the differential-to-single ended converter of FIG. 2 and which may receive a trim current generated by the VOS reduction circuit of FIG. 4.

FIG. 5 is a schematic diagram of a differential-to-single ended converter gain stage 27' which can utilize the trim current $I_{trim}$ to correct for voltage offset in the single-ended output $V_S'$ of the differential-to-single ended converter 44'. The gain stage 27' receives the single-ended output signal $V_{OUT}$ and modifies the single-ended output signal $V_{OUT}$ in response to the trim current $I_{trim}$ from IDAC 112 (FIG. 4). In particular, the $V_S'$ is controlled by the current through a transistor 154 and a diode 156. The transistor 154 and diode 156 are biased by a bias current from a bias current supply 158. By adjusting the current through transistor 154 and diode 156 with the trim current $I_{trim}$, the single-ended drive signal $V_S$, is adjusted for VOS in the input buffer 22 of the differential-to-single ended converter 44'. Since the trim current $I_{trim}$ is to adjust for variations in temperature, it is important that the function by which the bias current provided by bias current supply 158 varies with temperature substantially matches the function by which the VOS in the input buffer 22 varies with temperature.

While the present invention has been described in relationship to the embodiment described in the accompanying specification, other alternatives, embodiments, and modifications will be apparent to one skilled in the art. It is intended that the specification be only exemplary, and that true scope and spirit of the invention be indicated by the following claims.

What is claimed is:

1. A read channel system for reading digital data stored on a disk drive storage element, the read channel system comprising:

a magnetic read head that senses the digital data stored on the disk drive storage element and generates a corresponding analog read data signal;

pre-amplifier that pre-amplifies the analog read data signal to provide a pre-amplified analog read data signal;

a variable gain amplifier that receives the pre-amplified analog read data signal as an input and provides an amplified analog read signal as an output;

an equalizer that shapes transitions of the waveform of the amplified analog read signal to provide a differential equalized analog read signal;

an analog-to-digital converter (ADC) that converts the equalized analog read signal into a sequence of multi-bit digital data characters corresponding to the waveform of the equalized analog read signal, the ADC including (i) a resistive ladder network that includes a plurality of resistive elements connected in series to a positive voltage supply, the series-connected resistive elements having a mid-point voltage level and being connected to a negative voltage supply via a current source;

(ii) a differential-to-single ended converter that converts the differential equalized analog read signal to a corresponding single-ended analog read signal, the differential-to-single ended converter including a current gain stage to drive the signal-ended analog read signal at an output of the differential-to-single ended converter, wherein the differential-to-single ended converter is responsive to the mid-point voltage level of the resistive ladder network such that the single-ended analog read signal has a DC level equal to the mid-point of the resistive ladder network;

(iii) a comparator latch bank that receives a plurality of input signals from the resistive ladder network and the single-ended analog read signal and responds to first polarity transition edges of a clock signal by providing a plurality of comparator latch bank output signals;

(iv) an AND latch bank that receives the plurality of comparator latch bank output signals and responds to second polarity transition edges of the clock signal by providing a plurality of AND latch bank output signals; and (v) an OR latch bank that receives the plurality of AND latch bank output signals and responds to the first polarity transition edges of the clock signal by providing the sequence of multi-bit digital data characters;

a voltage offset (VOS) reduction circuit that reduces a DC voltage offset of the differential-to-single ended converter to thereby reduce an error in the digital output of the ADC, the VOS reduction circuit including (i) a comparator bank that receives a plurality of input signals from the resistive ladder network and the output of the differential-to-single ended converter and provides a plurality of comparator bank output signals in response thereto;

(ii) a latch bank that receives and latches the plurality of comparator bank output signals and provides a plurality of latch bank output signals in response thereto; and (iii) a current digital to analog converter (IDAC) that provides a current which is a function of the states of the plurality of latch bank output signals; and (iv) means for providing the current output from the IDAC as a trim current to the gain stage of the differential-to-single ended converter to thereby reduce a DC voltage offset of the output of the differential-to-single ended converter; and a digital signal processor that recovers the digital data from the sequence of multi-bit digital data characters.

2. An analog-to-digital converter (ADC) that converts a differential analog input signal into a sequence of multi-bit digital data characters corresponding to the waveform of the differential analog input signal, the ADC comprising:

a resistive ladder network that includes a plurality of resisters connected in series to a positive voltage supply, the series-connected resisters having a mid-point voltage level, the series-connected resister being connected to a negative voltage supply via a current source;

a differential-to-single ended converter that converts the differential analog signal to a corresponding single-ended analog signal, the differential-to-single ended converter including a current gain stage to drive the signal-ended analog signal at an output of the differential-to-single ended converter, wherein the differential-to-single ended converter is responsive to the mid-point voltage level of the resistive ladder network such that the single-ended analog signal has a DC level nominally equal to the mid-point of the resistive ladder network;

a comparator latch bank that receives a plurality of signals output from the resistive ladder network and the single-ended analog signal and responds to first polarity transition edges of a clock signal by providing a plurality of comparator latch bank output signals;

an AND latch bank that receives the plurality of comparator latch bank output signals and responds to second polarity transition edges of the clock signal by providing a plurality of AND latch bank output signals;

an OR latch bank that receives the plurality of AND latch bank output signals and responds to the first polarity transition edges of the clock signal by providing the sequence of multi-bit digital data characters; and a voltage offset (VOS) reduction circuit that operates in a configuration mode to receive at least a portion of the plurality of output signals from the resistive ladder network and a single-ended analog signal output from the differential-to-single ended converter that corresponds to a zero magnitude differential signal, and to generate a trim current responsive thereto, wherein the VOS reduction circuit also generates the trim current when the ADC is operating in an operating mode wherein the gain stage includes means for receiving the trim current and for adjusting the DC level of the single-ended signal in response thereto.

3. A read channel system for reading digital data stored on a storage element, the read channel system comprising:

a read head that senses the digital data stored on the storage element and generates a corresponding analog read data signal;

a pre-amplifier that pre-amplifies the analog read data signal to provide a pre-amplified analog read data signal;

a first, variable gain, amplifier that receives the pre-amplified analog read data signal as an input and provides an amplified analog read signal as an output;

an equalizer that shapes transitions of the waveform of the amplified analog read signal to provide an equalized analog read signal;

an analog-to-digital converter (ADC) that converts tile equalized analog read signal into a sequence of multi-bit digital data characters corresponding to the waveform of the equalized analog read signal, the ADC including

7

(i) a resistive ladder network that includes a plurality of resistive elements connected in series to a positive voltage supply, the series-connected resistive elements having a mid-point voltage level and being connected to a negative voltage supply via a current source;

(ii) a second amplifier including a current gain stage to drive the analog read signal at an output of the second amplifier, wherein the second amplifier is responsive to the mid-point voltage level of the resistive ladder network such that the amplified analog read signal has a DC level equal to the mid-point of the resistive ladder network;

(iii) a comparator latch bank that receives a plurality of input signals from the resistive ladder network and the amplified analog read signal and responds to first polarity transition edges of a clock signal by providing a plurality of comparator latch bank output signals;

(iv) a converter circuit that converts the plurality of comparator latch bank output signals into the sequence of multi-bit digital data characters;

a voltage offset (VOS) reduction circuit that reduces a DC voltage offset of the second amplifier to thereby reduce an error in the digital output of the ADC, the VOS reduction circuit including (i) a comparator bank that receives a plurality of input signals from the resistive ladder network and the output of the second amplifier and provides a plurality of comparator bank output signals in response thereto;

(ii) a latch bank that receives and latches the plurality of comparator bank output signals and provides a plurality of latch bank output signals in response thereto; and (iii) a current digital to analog converter (IDAC) that provides a current which is a function of the states of the plurality of latch bank output signals; and (iv) means for providing the current output from the IDAC as a trim current to the gain stage of the second amplifier to thereby reduce a DC voltage offset of the output of the second amplifier; and a digital signal processor that recovers the digital data from the sequence of multi-bit digital data characters.

4. The read channel system of claim 1, wherein the read head is a magnetic read head.

5. The read channel system of claim 3, wherein the comparator bank of the VOS reduction circuit provides the plurality of comparator bank output signals in response to a first polarity transition of a VOS circuit control signal and the latch bank latches the plurality of comparator bank output signals in response to a second polarity transition of the VOS circuit control signal.

6. The read channel system of claim 5, and further comprising means for powering down the comparator bank in response to the second polarity transition of the VOS circuit control signal.

7. An analog-to-digital converter (ADC) that converts an analog input signal into a sequence of multi-bit digital data characters corresponding to the waveform of the analog input signal, the ADC comprising:

a resistive ladder network that includes a plurality of resisters connected in series to a positive voltage supply, the series-connected resisters having a mid-

8 point voltage level, the series-connected resister being connected to a negative voltage supply via a current source;

an amplifier that amplifies the analog signal, the amplifier including a current gain stage to drive the analog signal at an output of the amplifier, wherein the amplifier is responsive to the mid-point voltage level of the resistive ladder network such that the amplified signal has a DC level nominally equal to the mid-point of the resistive ladder network;

a comparator latch bank that receives a plurality of signals output from the resistive ladder network and the amplified analog signal and responds to first polarity transition edges of a clock signal by providing a plurality of comparator latch bank output signals;

a converter circuit that converts the plurality of comparator latch bank output signals into the sequence of multi-bit digital data characters;

a voltage offset (VOS) reduction circuit that operates in a configuration mode to receive at least a portion of the plurality of output signals from the resistive ladder network and the amplified analog signal from the amplifier that corresponds to a zero magnitude analog signal, and to generate a trim current responsive thereto, wherein the VOS reduction circuit also generates the trim current when the ADC is operating in an operating mode wherein the gain stage includes means for receiving the trim current and for adjusting the DC level of the amplified analog signal in response thereto.

8. The ADC of claim 7, wherein the VOS reduction circuit includes:

a comparator bank that, in the configuration mode, receives a plurality of input signals from the resistive ladder network and the output of the amplifier and provides a plurality of comparator bank output signals in response thereto;

a latch bank that, in the configuration mode, receives and latches the plurality of comparator bank output signals and provides a plurality of latch bank output signals in response thereto; and a current digital to analog converter (IDAC) that provides a current which is a function of the states of the plurality of latch bank output signals; and means for providing the current output from the IDAC in the operating mode as a trim current to the gain stage of the amplifier to thereby reduce a DC voltage offset of the output of the amplifier.

9. The ADC of claim 7, wherein a first polarity transition of a VOS circuit control signal indicates that the VOS reduction circuit is in the configuration mode, to cause the comparator bank of the VOS reduction circuit provides the plurality of comparator bank output signals in response thereto, and the latch bank latches the plurality of comparator bank output signals in response to a second polarity transition of the VOS circuit control signal.

10. The ADC of claim 9, wherein the second polarity transition of the VOS circuit control signal indicates that the VOS reduction circuit is in the operating mode, wherein the VOS reduction circuit further includes means for powering down the comparator bank in response thereto.

* * * * *

UNITED STATES PATENT AND TRADEMARK OFFICE
CERTIFICATE OF CORRECTION

PATENT NO.: 5,635,934
DATED: June 3, 1997
INVENTOR(S): GARY ALLEN BROWN

It is certified that error appears in the above-identified patent and that said Letters Patent is hereby corrected as shown below:

In Col. 6, line 63, delete "tile" and replace with --the--.

In Col. 7, line 45, delete "1" and replace with --3--.

Signed and Sealed this

Fifth Day of August, 1997

Attest:

BRUCE LEHMAN

Attesting Officer

Commissioner of Patents and Trademarks